United States Patent [19]

Downey

[11] Patent Number: 4,474,831
[45] Date of Patent: Oct. 2, 1984

[54] METHOD FOR REFLOW OF PHOSPHOSILICATE GLASS

[75] Inventor: Daniel F. Downey, Magnolia, Mass.

[73] Assignee: Varian Associates, Inc., Palo Alto, Calif.

[21] Appl. No.: 412,455

[22] Filed: Aug. 27, 1982

[51] Int. Cl.³ .................. H01L 21/268; H01L 21/324
[52] U.S. Cl. ...................................... 427/55; 65/102; 65/104; 427/85; 427/93; 427/398.1; 427/444
[58] Field of Search ................... 427/55, 85, 93, 444, 427/398.1; 65/102, 104

[56] References Cited

U.S. PATENT DOCUMENTS

| | | |
|---|---|---|
| 3,901,183 | 8/1975 | Wittkower . |
| 3,954,191 | 5/1976 | Wittkower et al. . |
| 4,417,347 | 11/1983 | Muka ................................ 373/158 |
| 4,417,914 | 11/1983 | Lehrer ................................. 427/93 |
| 4,420,503 | 12/1983 | Leang ................................. 427/85 |

OTHER PUBLICATIONS

Armstrong et al., "A Scanning Electron Microscope Investigation of Glass Flow in MOS Integrated Circuit Fabrication," *J. Electrochem. Soc.: Sol. State Sci. and Technol.*, vol. 121, No. 2, Feb. 1974, p. 307.
Razouk et al., "Pressure Induced Phosphosilicate Glass Flow," *J. Electrochem. Soc.: Extended Abstracts*, vol. 82-1, May 1982, p. 138.
Jeuch et al., "P-Glass Reflow with a Tunable CO₂ Laser," Poster Paper, Materials Res. Soc. Conf., Boston, Nov. 16-20, 1981.
Delfino et al., "Laser Activated Flow of Phosphosilicate Glass," *J. Electrochem. Soc.: Extended Abstracts*, vol. 82-1, May 1982, p. 143.
Pending Application Ser. No. 262,838, filed May 12, 1981, Muka and Russo.
Kern et al., "Improved Reliability of Electron Devices Through Optimized Coverage of Surface Topography," *Eleventh Annual Proc. Reliability Physics*, p. 214 (1973).
Delfino et al., "Laser Activated Flow of Phosphosilicate Glass in Integrated Circuit Devices," *IEEE Electron Device Letters*, vol. EDL-3, No. 5, May 1982, p. 116.
Hashimoto et al., "Glass Flow Mechanism of Phosphosilicate Glass and Its Application in MOS Devices," *Jap. J. Appl. Phys.*, vol. 16, Supp. 16-1, p. 73 (1977).
Naumann et al., "Phosphosilicate Glass Flow for Integrated Optics," *J. Vac. Sci. Technol.*, vol. 17(1), Jan.-/Feb. 1980, p. 529.

*Primary Examiner*—John D. Smith
*Attorney, Agent, or Firm*—Stanley Z. Cole; William R. McClellan

[57] ABSTRACT

In a method for reflow of a phosphosilicate glass (PSG) layer applied to a semiconductor wafer, the wafer is placed in a processing chamber in parallel alignment with a planar blackbody source. The chamber is evacuated, and the source rapidly and uniformly heats the PSG layer to a temperature at which plastic flow occurs. The blackbody source provides significant radiation in the 7-10 micron portion of the infrared spectrum. The thermal treatment is typically completed in 8-15 seconds, thereby avoiding impurity redistribution in the semiconductor device.

5 Claims, 6 Drawing Figures

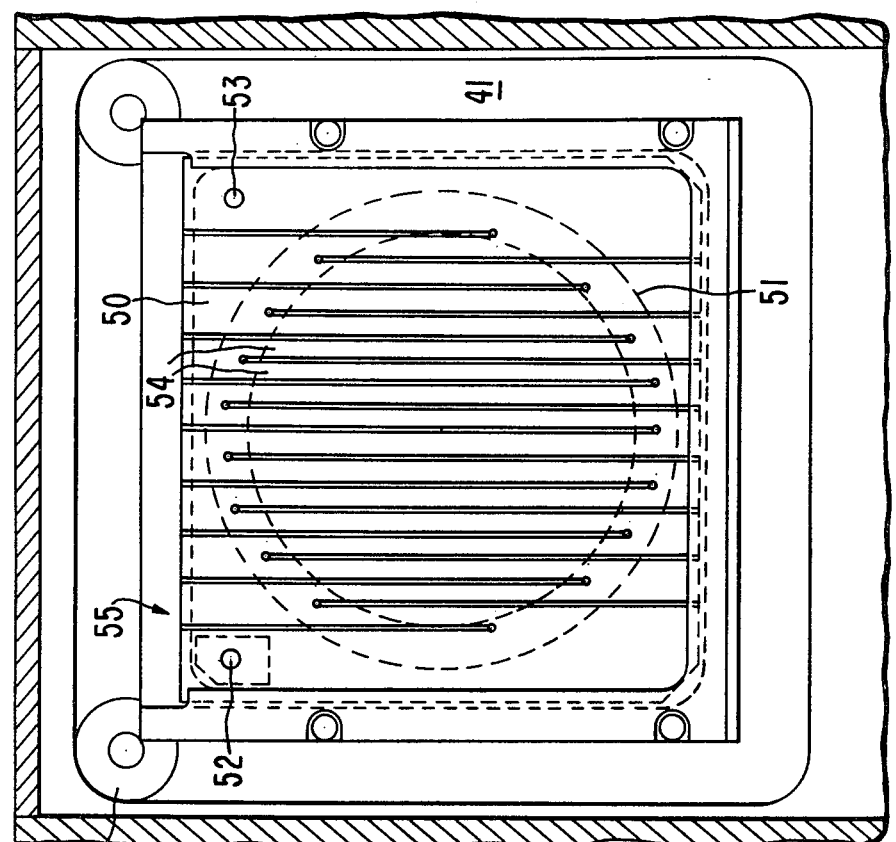
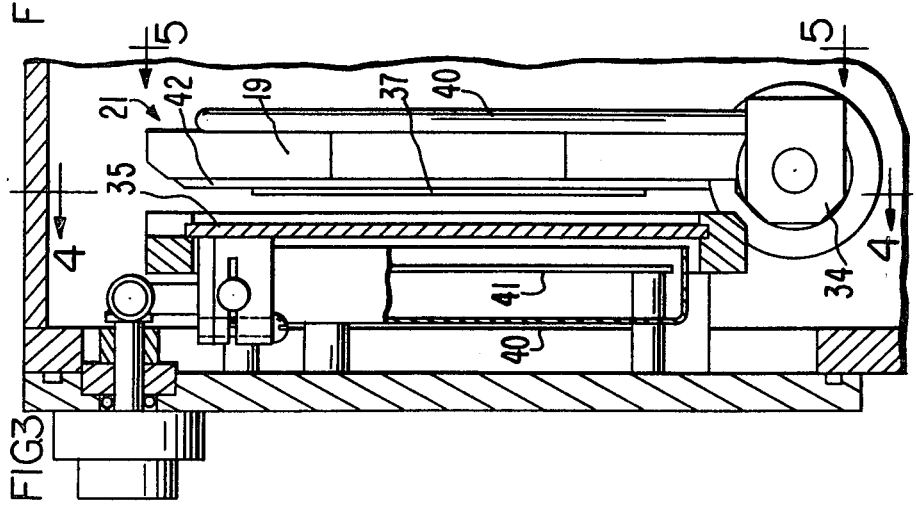

METHOD FOR REFLOW OF PHOSPHOSILICATE GLASS

DESCRIPTION

Background of the Invention

This invention relates to the fabrication of semiconductor devices and, more particularly, to the reflow of glass insulating layers of semiconductor devices to provide uniform coverage and tapered step coverage over the surface area to be covered.

In the fabrication of semiconductor devices, multiple layers of material are applied to the surface of a semiconductor wafer, typically, silicon. The layers can be applied by a variety of processes such as diffusion, ion implantation, and chemical vapor deposition. Each of the layers has one or more specific functions. As semiconductor devices become progressively more complex and more miniaturized, the processes used to fabricate these devices become more specialized and critical.

Phosphosilicate glass, which is silicon dioxide doped with a prescribed amount of phosphorous, has been widely used as an insulating layer between conductive elements in semiconductor devices. Phosphosilicate glass (PSG) is advantageous as a passivating layer because of its alkali ion gettering capability. PSG layers are also used to modify the surface topography in very large scale integrated circuits where the substrate topography is very complex due to the multilayer nature of the structure. Chemical vapor deposited PSG is relatively nonuniform over the surface area of the device and exhibits poor step coverage. Therefore, PSG layers have been heated to their softening point to produce plastic flow and result in uniform thickness and tapered step coverage. Uniform coverage is necessary to preserve the insulating properties of the layer, while tapered step coverage is necessary to prevent dielectric breakdown at steps in the underlying device layers. In the case of very large scale integrated circuits, reflow of the PSG layer smoothes irregularities in the surface of the device.

PSG layers with phosphorous concentration in the range between about 6% and 10% are commonly used. At phosphorous concentrations, below about 6%, the melting point of the PSG layer is very high. At phosphorous concentrations above about 10%, the PSG layer becomes hygroscopic and causes device reliability problems.

Various processes have been employed to provide reflow of PSG layers. The conventional technique for producing PSG reflow is by treatment in a furnace at temperatures of 1000° C. to 1100° C. for times in the range of 10 to 60 minutes. A nitrogen ambient has commonly been used. See, for example, Armstrong et al, "A Scanning Electron Microscope Investigation of Glass Flow in MOS Integrated Circuit Fabrication," J. Electrochem. Soc.: Solid State Science and Technology, Vol. 121, No. 2, February 1974, p. 307. PSG reflow in furnaces has been enhanced by the use of oxygen or steam ambients. It has also been determined that the time and/or temperature for furnace treatment of PSG can be reduced by increasing the ambient pressure in the furnace. See, for example, Razouk et al, "Pressure Induced Phosphosilicate Glass Flow," J. Electrochem. Soc.: Extended Abstracts, Vol. 82-1, May 1982, p. 138. PSG reflow resulting from furnace treatment is generally satisfactory. However, the treatment of semiconductor wafers at such temperatures for significant lengths of time produces undesirable spreading or redistribution of the dopant impurities both laterally and vertically. This is especially undesirable for high dose implants on the order of $10^{15} - 2 \times 10^{16}$ per square centimeter such as are used in fabricating high density MOS devices. Redistribution also makes shallow junction and/or VLSI devices difficult if not impossible to fabricate. Also, conventional furnace treatment is time-consuming and is not particularly energy efficient.

Laser beams have also been used to achieve PSG reflow. A beam from a carbon dioxide laser operating in the 9-11 micrometer range has been focused and scanned over the surface of a semiconductor wafer, thereby producing localized heating and reflow of the PSG layer. See, for example, Jeuch et al, "P-Glass Reflow With a Tunable $CO_2$ Laser," Poster Paper, Materials Research Society Conference, Boston, Nov. 16-20, 1981, and Delfino et al, "Laser Activated Flow of Phosphosilicate Glass," J. Electrochem. Soc.: Extended Abstracts, Vol. 82-1, May 1982, p. 143. Laser treatment provides generally satisfactory PSG reflow and, due to its rapid heating of the PSG layer, largely eliminates the problem of impurity redistribution in the semiconductor material. However, laser beams are highly energy inefficient and require mechanical, electro-optical or electromechanical means for scanning and focusing of the beam, thereby increasing the complexity of the thermal treatment system. In addition, the extremely rapid heating of the PSG layer by the laser may cause the PSG to crack, peel, or lift off the wafer.

Pending application Ser. No. 262,838, filed May 12, 1981 now U.S. Pat. No. 4,417,347 and assigned to the assignee of the present application discloses a processor in which a blackbody radiator having a constant planar energy flux characteristic is placed in opposition to a semiconductor material. The blackbody source is capable of annealing crystal damage in semiconductor wafers and of activating impurity dopants in the silicon in times on the order of ten seconds.

It is an object of the present invention to provide new and improved methods for causing plastic flow of a glass layer applied to the surface of a semiconductor material.

It is another object of the present invention to provide methods for thermally treating a semiconductor wafer so as to cause plastic flow of a phosphosilicate glass layer while reducing impurity dopant redistribution in the semiconductor wafer.

It is yet another object of the present invention to provide a simple and high speed method for causing plastic flow of a glass layer applied to the surface of a semiconductor wafer so that the layer has uniform thickness and tapered step coverage.

SUMMARY OF THE INVENTION

According to the present invention, these and other objects and advantages are achieved in a method for treating an article having an insulating glass layer applied to a surface thereof so as to cause plastic flow of the glass layer. The method comprises the steps of introducing the article into a processing chamber, reducing the pressure in the processing chamber, and heating the article in the chamber by a blackbody source having a constant planar energy flux characteristic. The article is positioned in essentially parallel planar alignment with the blackbody source and is heated for a sufficient time and to a sufficient temperature by the blackbody source to cause plastic flow of the glass layer.

BRIEF DESCRIPTION OF THE DRAWINGS

For a more complete understanding of the present invention, reference may be had to the accompanying drawings which are incorporated herein by reference and in which:

FIG. 3 is an edge view of a platen for holding a semiconductor wafer in the processor apparatus of FIGS. 1 and 2;

FIG. 4 is a frontal view of a blackbody radiator which produces a constant planar energy flux for incorporation in the processor apparatus of FIGS. 1 and 2.

DETAILED DESCRIPTION OF THE INVENTION

According to the present invention, there is provided a method for treating an article, typically a semiconductor wafer, having an insulating glass layer applied to a surface thereof. The treatment causes plastic flow of the glass layer resulting in a glass layer with good uniformity and tapered step coverage. The glass most commonly used in semiconductor processing is phosphosilicate glass (PSG) with a phosphorous concentration between 6 and 10 percent by weight. The semiconductor wafer is introduced into a processing chamber. Positioned within the chamber is a blackbody source having a constant planar energy flux characteristic. The blackbody source has significant emission in the 7–10 micron region of the infrared spectrum. The semiconductor wafer is positioned in essentially parallel planar alignment with the blackbody source. The processing chamber is then evacuated, and the blackbody source is energized or is exposed to the wafer by removal of a shutter plate. The blackbody source rapidly heats the PSG layer to a sufficient temperature to cause plastic flow thereof. The wafer is then removed from the vicinity of the blackbody source and cooled. The entire process takes on the order of seconds or tens of seconds, thereby inhibiting impurity redistribution. Due to the planar nature of the blackbody source, the PSG layer is uniformly heated over the surface area of the wafer.

Figure 1:
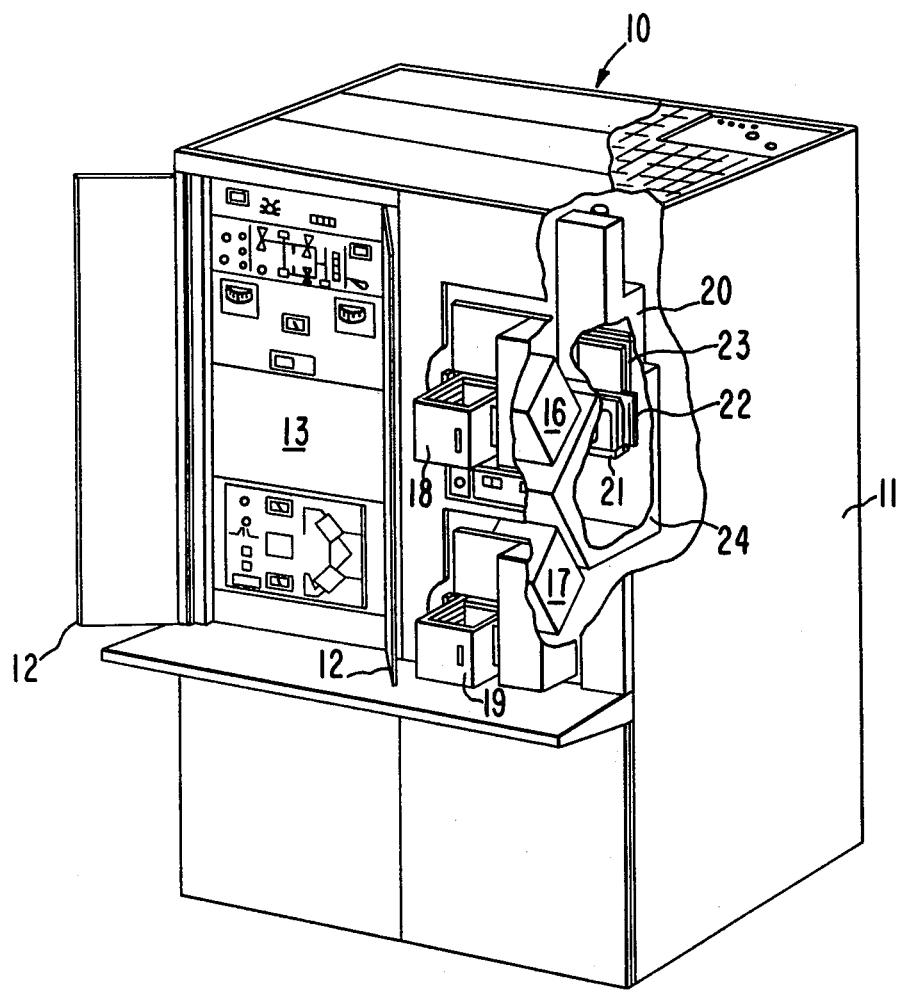
FIG. 1 is a perspective, partially broken away view of processor apparatus utilized to practice the method of the present invention.
Figure 2:
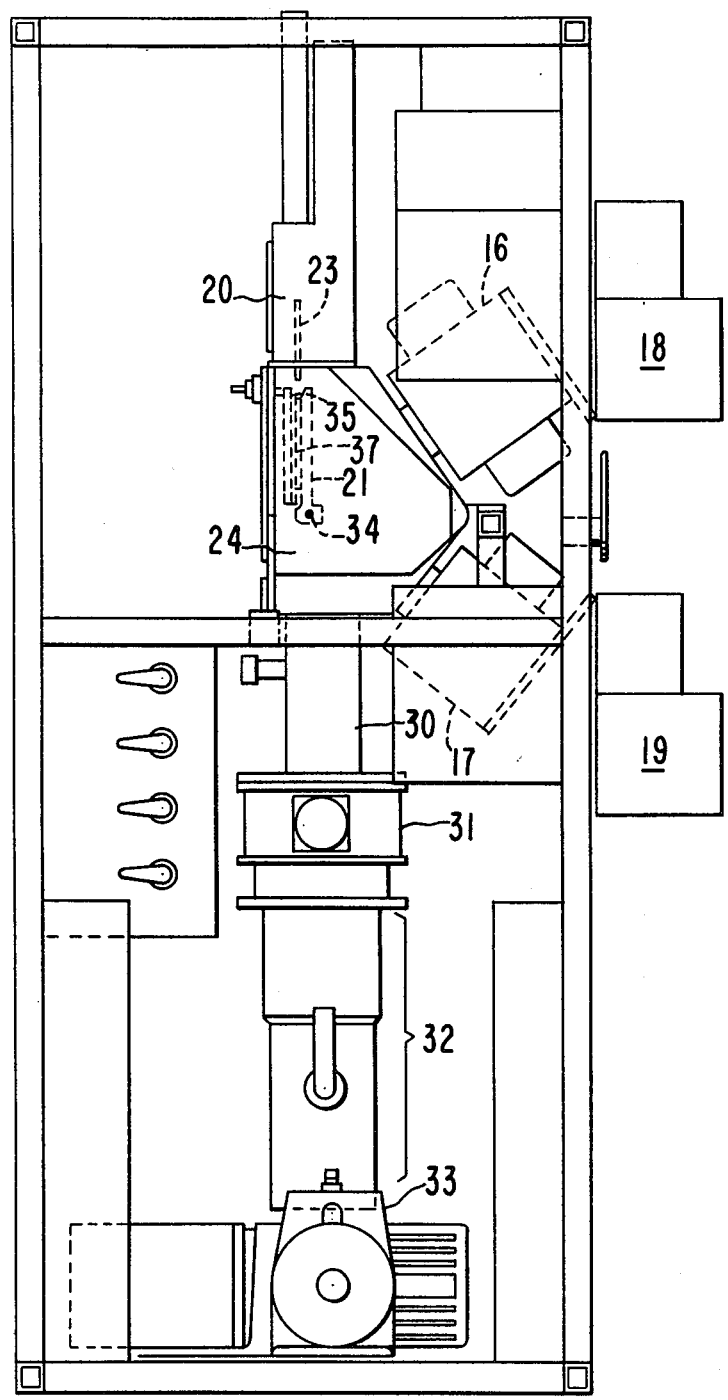
FIG. 2 is a side view of the apparatus of FIG. 1.

A processor apparatus which is suitable for carrying out the method of the present invention is illustrated in FIGS. 1 and 2. The processor is configured to receive, thermally treat and discharge semiconductor wafers. Processor apparatus 10 is shown in FIG. 1 in partially broken-away perspective view and is generally representative of the IA-200 Isothermal Annealer manufactured and sold by the Extrion Division of Varian Associates, Inc. Electronic control panels 13 are included within housing 11 and are accessible through doors 12. The apparatus utilizes a Wayflow TM gravity in, gravity out end station, as described in U.S. Pat. No. 3,901,183, issued Aug. 26, 1975 to Wittkower, for insertion and removal of silicon wafers. In the Wayflow TM end station, a wafer is inserted from a cassette placed in cassette holder 18 through entrance lock 16 (see U.S. Pat. No. 3,954,191, issued May 4, 1976 to Wittkower et al) into vacuum chamber 24, 20. The wafer slides by gravity feed onto a platen 21, which is then oriented in an appropriate receiving position. After insertion of the wafer, platen 21 is rotated on axis 34 to an annealing position in opposition to blackbody source 22. Blackbody source 22 may be shuttered by shutter plate 23 until the platen brings the wafer in opposition. Alternatively, source 22 may be on but idled until the wafer is in place or some other transitional variation may be employed. The distance between the wafer and blackbody source 22 may vary from about one-fourth inch to as far as practicable. The actual distance is determined by uniformity requirements and the space taken up by shutter, shields and platen. For uniformity, the active area of the source is preferably at least as large as the wafer, since the viewing factor from source to wafer must be as high and uniform as possible. The temperature of the blackbody source is typically between 1000° C. and 1500° C. to accomplish PSG reflow, and the treatment time varies between 5 and 60 seconds, as described hereinafter. Heating is radiative so that the wafer increases in temperature until at equilibrium it is nearly at the temperature of the thermal source. In certain cases, however, the wafer does not reach equilibrium, since reflow is accomplished before the wafer reaches equilibrium temperature. After PSG reflow is accomplished, the wafer is removed through exit lock 17 into a cassette in cassette holder 19.

To promote uniform heating, it is desired to heat by radiation and not by convection. Control is maintained over the pressure at least between the blackbody source and the semiconductor material. The pressure in this region varies from $10^{-7}$ Torr to ambient and is selected so that the mean free path of the gas is much greater than the source-to-wafer distance. Significant conduction heating is thereby eliminated. As seen in FIG. 2, a mechanical roughing pump 33 is used in series with a diffusion pump 32 to evacuate chamber 24 through tube 30 and baffle 31. Thus, the pressure in work chamber 24, 20 is controlled at the desired level, with the criterion being, as stated above, that the mean free path of the gas molecules should be much larger than the distance between the blackbody source 35 and the wafer 37. Consequently, radiative heating by thermal source 35 predominates.

The wafer 37 is heated by a constant planar energy flux produced by blackbody radiation source 35. The term constant planar energy flux means that across a planar front a constant energy flux is produced by this source. The power may vary due to ramping of the source but the energy flux across the planar front will remain constant. The planar isotherm uniformly heats the wafer 37. This occurs in part because blackbody radiation is primarily in the infrared and silicon is partially transparent to infrared. Thus, the radiation penetrates a several hundred micron thick wafer in milliseconds and heats it uniformly. For PSG reflow, blackbody radiation in the 7–10 micron portion of the infrared spectrum is of primary interest.

When thermal treatment is complete, the thermal source is either shuttered by means of mechanical shutter 23 shown in FIG. 1, is idled or is shut off. If the wafer is silicon, it is preferably cooled down to 700° C. or less so that it may be removed from the annealing chamber. This is accomplished by actively cooling the platen or by rotating the platen so that the wafer radiates to the walls of the chamber which appear as a blackbody sink. As shown in FIG. 3, the platen 21 is comprised of a metal block 19 having coiled cooling tubes 40 affixed to the back thereof. The cooling tubes 40 contain chilled water (10°–15° C. at one gallon per minute) or other coolant and are connected by feed-throughs (not shown) to a source external to the annealing chamber. On the front side of the platen to foster uniform annealing, a circumferential strip 42 made from a refractory metal is provided. This strip may be heated to ensure a uniform temperature profile between the edges of the wafer and the center. Planar shields 40 and 41 are also positioned between thermal source 35 and the walls of the vacuum chamber. These shields reduce the thermal losses in accordance with the formula $1/n+1$ where n is the number of shields in succession, providing there is a vacuum separation between each shield.

One embodiment of the blackbody radiator 35 is shown in detail in FIG. 4. To obtain uniform heating over the area of the wafer, the blackbody source describes a uniform thermal gap over its surface. This uniform thermal map produces a planar thermal front, that is, on parallel planes in front of the source the same temperature is experienced. Thus, since heating of the wafer is radiative, the radiation heats the wafer with two dimensional isotropy. To produce the isotherms a planar source is preferably, although not necessarily, used.

The preferred blackbody source is a resistive material which can be molded or cut into a planar shape containing a pattern of strips. The most preferred source is graphite, one example of which is Stackpole 2020 which is available in sheet form and can be cut into the serpentine pattern shown in FIG. 4. A sheet 50 of graphite about one-sixteenth to one-eighth inch thick is configured to produce the serpentine pattern consisting of strips 54. The corners of blackbody source 55 are mounted on a metal frame 41 on opposing corners thereof by means of conductive contact studs 52 and 53. In a preferred embodiment the carbon sheet is counter-bored before the strips are cut out in order to reduce the sheet thickness within the circumference 51. As a consequence, the temperature is highest in the circular zone within circumference 51, the zone that is placed in opposition to a wafer held in a platen. Typically, such a planar serpentine strip source will use a power supply of about 5 kilowatts, although the more efficient the shielding the lower the required power input. For the most uniform heating the effective area of the blackbody source must be at least as large as the wafer being heated, and the wafer should be as close to the source as practicable.

In reflowing PSG in accordance with the process of the present invention, it is preferred that the planar blackbody heater be raised to a temperature between 1000° C. and 1500° C. for a period between 5 and 60 seconds depending on the phosphorous content of the PSG. It will be realized by those skilled in the art that, as the phosphorous content increases, the melting point of the PSG decreases. Therefore, the time and/or temperature of the treatment can be reduced for PSG layers with higher phosphorous content. It also will be realized that for a given PSG composition various time and temperature combinations can be utilized to accomplish reflow of the PSG layer. It is further preferred that during the treatment of the PSG by the planar blackbody heater the processing chamber be maintained at a vacuum in the range between $10^{-3}$ and $10^{-7}$ Torr.

In one example of PSG reflow utilizing the apparatus described hereinabove, PSG doped with 8% phosphorous was processed with a heater temperature of 1450° C. and an 8 second exposure. Excellent reflow results were obtained, as indicated by scanning electron microscope (SEM) analysis. PSG doped with 6% phosphorous was processed with a heater temperature of 1450° C. and a 15 second exposure creating smooth contour and tapered side walls. Higher temperature and/or longer time exposures are required for PSG with lower percent phosphorous content, while the converse is true for higher percent phosphorous content. Depending on the desired results, different time and temperature combinations provide excellent results. For example, on PSG with 8% phosphorous content other successful combinations are 1100° C. for 35 seconds, 1250° C. for 20 seconds and 1350° C. for 10 seconds. These time and temperature combinations can be slightly adjusted to alter the amount of reflow obtained. Similar time-temperature combinations can be determined for treating PSG with other phosphorous contents. In treating PSG layers in accordance with the process of the present invention, it has been found that dopant redistribution has been significantly reduced in comparison with furnace annealing methods. This is primarily due to the much shorter time duration required for the process of the present invention.

Figure 5A:
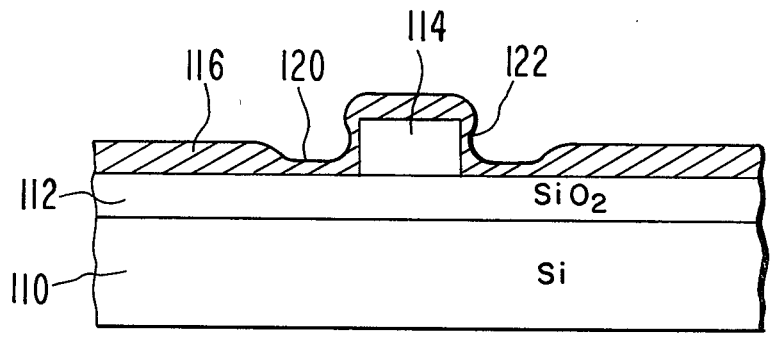
FIG. 5A and 5B are cross-sectional views of a typical semiconductor wafer illustrating a phosphosilicate glass layer before and after, respectively, treatment in accordance with the present invention.
Figure 5B:
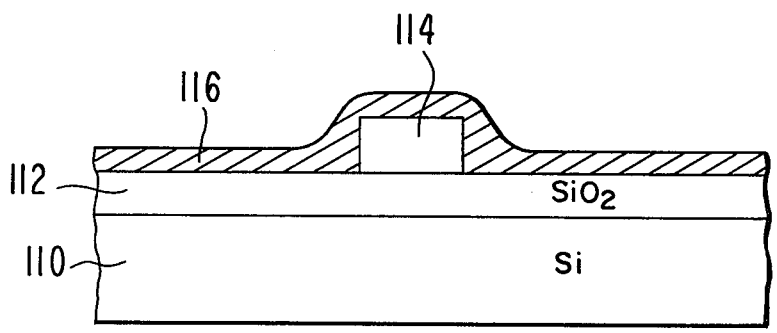

Referring now to FIG. 5A, there is shown an example of a semiconductor device during fabrication. The device includes planar layers 110, 112 and a step 114 which can be formed by conventional methods of photolithography and etching. A phosphosilicate glass layer 116 is applied to the surface of the device typically by chemical vapor deposition. The layer 116 typically acts as an insulator between the layer 114 and subsequently applied conductive layers such as metallizations. As deposited, the layer 116 is typically nonuniform in thickness, as indicated at 120, and does not provide good coverage of the step 114, as indicated at 122. The layer 116 typically has a thickness of 1–2 microns. Upon heating of the layer 116 in accordance with the method of the present invention, the material softens to a point where plastic flow can occur. The heating should not be so great as to cause a change to the liquid state. The plastic flow causes areas of non-uniform thickness to be smoothed over and the coverage of steps to be tapered. Step coverage tapers in the vicinity of 45 degrees have been obtained using the method of the present invention. They layer 116 after reflow is illustrated in FIG. 5B.

It is believed that the method of the present invention is effective in accomplishing PSG reflow due to selective absorption of infrared radiation from the blackbody source within the PSG by radiative coupling with the Si-O bond which has a strong absorption band at 9.25 micron wavelengths and by radiative coupling with the P-O bond which has a strong absorption band at about 7.7 microns. The underlying doped silicon substrate will also absorb infrared radiation, and the two layers will come to thermal equilibrium through conductive mechanisms. It is critical to the integrity of the thin PSG layer that both the PSG layer and the Si come to temperatures at rates comparable enough not to cause thermal stress and hence cracking and peeling of the PSG layer. Such a situation can occur when a monochromatic light source, such as a laser, which only couples with a band within the PSG (e.g., the Si-O bond or the P-O bond), is used. A similar situation can occur when a blackbody source which does not have sufficient intensity in the infrared region between 7 and 10 microns, such as a blackbody source which peaks in or near the optical range, is used. In this case, the Si absorbs all of the radiation, heating up much more rapidly than the SiO$_2$ layer.

The amount of radiative coupling with the PSG layer also depends on the thickness of the layer. It is most common to use a PSG layer between 1 and 2 microns thick which adequately couples with the blackbody radiative source described herein (which has a peak at about 2.0 microns at 1400° C.) Thin PSG layers may not absorb enough radiation to heat at a sufficient rate compared to the bulk doped silicon, thereby causing damage to the PSG layer. In accordance with the present invention, the absorption ratio of the PSG layer (or any glass layer) is adjusted to that of the silicon (or any substrate) by adjusting the blackbody spectral distribution of the radiative source either by filters, multiple sources or by other source design.

While the method of the present invention has been described with reference to PSG, it will be realized that the method can be applied to other types of glass such as borosilicate and arsenosilicate. The requirement is that the planar blackbody source have the capability of heating the glass layer rapidly to the point where plastic flow occurs.

Thus, there is provided by the present invention a method for causing plastic flow of a glass layer applied to a surface of a semiconductor device. The method accomplishes glass reflow very rapidly, thereby reducing impurity redistribution to a negligible level. In addition, the method is simple and energy-efficient.

While there has been shown and described what is at present considered the preferred embodiments of the invention, it will be obvious to those skilled in the art that various changes and modifications may be made therein without departing from the scope of the invention on as defined by the appended claims.

What is claimed is:

1. A method for producing plastic flow of a glass layer applied to a surface of a semiconductor wafer, said method comprising the steps of:
   introducing said wafer with said glass layer into a processing chamber;
   reducing the pressure in said processing chamber to the range between $10^{-3}$ Torr and $10^{-7}$ Torr; and
   exposing said wafer with said glass layer in said chamber to a blackbody source having a constant planar energy flux characteristic, having substantial radiation in an absorption band of said glass layer and having a temperature in the range between 1000° C. and 1500° C. for a time between 5 and 60 seconds, said wafer being positioned in essentially parallel alignment with said source.

2. The method as defined in claim 1 wherein said glass layer is a phosphosilicate glass layer and said blackbody sourse provides substantial radiation in the spectral range between 7 and 10 microns.

3. The method as defined in claim 2 further including, after said step of exposing said wafer, the step of cooling said wafer with said phosphosilicate glass layer in said processing chamber by radiative cooling.

4. The method as defined in claim 3 wherein said blackbody source has a temperature in the range between 1100° C. and 1450° C. and said wafer with said glass layer is exposed to said blackbody source for a time between 8 and 35 seconds.

5. The method as defined in claim 1 further including the step of adjusting the spectral distribution of said blackbody source so as to substantially balance the heating rates of said glass layer and said semiconductor wafer whereby thermal stress is avoided.

* * * * *